(12) United States Patent
van der Heijden et al.

(10) Patent No.: US 10,090,810 B2
(45) Date of Patent: Oct. 2, 2018

(54) DOHERTY AMPLIFIERS

(71) Applicant: NXP B.V., Eindhoven (NL)

(72) Inventors: Mark Pieter van der Heijden, Eindhoven (NL); Jozef Reinerus Maria Bergervoet, Eindhoven (NL); Ivan Mitkov Zahariev, Nijmegen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/601,661

(22) Filed: May 22, 2017

(65) Prior Publication Data

US 2018/0006612 A1 Jan. 4, 2018

(30) Foreign Application Priority Data

Jun. 30, 2016 (EP) ..................................... 16177369

(51) Int. Cl.
| | | |
|---|---|---|
| *H03F 3/68* | (2006.01) | |
| *H03F 1/02* | (2006.01) | |
| *H03F 1/56* | (2006.01) | |
| *H03F 3/21* | (2006.01) | |
| *H01L 23/66* | (2006.01) | |
| *H03F 3/195* | (2006.01) | |

(52) U.S. Cl.
CPC ........... *H03F 1/0288* (2013.01); *H01L 23/66* (2013.01); *H03F 1/565* (2013.01); *H03F 3/195* (2013.01); *H03F 3/211* (2013.01); *H03F 2200/391* (2013.01); *H03F 2200/423* (2013.01); *H03F 2200/537* (2013.01); *H03F 2200/541* (2013.01)

(58) Field of Classification Search
CPC .................................. H03F 1/0288; H03F 3/68
USPC .............................................. 330/124 R, 295
See application file for complete search history.

(56) References Cited

U.S. PATENT DOCUMENTS

| | | | |
|---|---|---|---|
| 8,228,123 B2 | 7/2012 | Blednov | |
| 2016/0028351 A1 | 1/2016 | Jin et al. | |
| 2016/0218693 A1* | 7/2016 | Lyalin | ..................... H01Q 7/00 |
| 2018/0006021 A1 | 1/2018 | Bergervoet et al. | |
| 2018/0006611 A1 | 1/2018 | de Jong et al. | |
| 2018/0006614 A1 | 1/2018 | Hoogzaad et al. | |

FOREIGN PATENT DOCUMENTS

| | | |
|---|---|---|
| EP | 2 806 557 A1 | 5/2013 |
| EP | 2 770 634 A1 | 8/2015 |
| WO | WO-2013/133215 A1 | 9/2013 |

OTHER PUBLICATIONS

Giofre, Rocco et al; "A Closed-Form Design Technique for Ultra-Wideband Doherty Power Amplifiers"; IEEE Transactions on Microwave Theory and Techniques, vol. 62, No. 12; 11 pages (Dec. 2014).

(Continued)

*Primary Examiner* — Steven J Mottola

(57) ABSTRACT

A Doherty amplifier comprising: a main-power-amplifier having a main-amp-output-terminal; a peaking-power-amplifier having a peaking-amp-output-terminal; a combining node; a main-output-impedance-inverter connected between the main-amp-output-terminal and the combining node; and a transformer connected between the peaking-amp-output-terminal and the combining node.

15 Claims, 5 Drawing Sheets

(56) References Cited

OTHER PUBLICATIONS

Kang, Daehyun et al; "Design of Bandwidth-Enhanced Doherty Power Amplifiers for Handset Applications"; IEEE Transactions on Microwave Theory and Techniques, vol. 59, No. 12; 10 pages (Dec. 2011).

Solomko, Valentyn A. et al; "A Fully Integrated 3.3-3.8-GHz Power Amplifier With Autotransformer Balun"; IEEE Transactions on Microwave Theory and Techniques, vol. 57, No. 9; 13 pages (Sep. 2009).

\* cited by examiner

DOHERTY AMPLIFIERS

CROSS-REFERENCE TO RELATED APPLICATIONS

This application claims the priority under 35 U.S.C. § 119 of European patent application no. 16177369.2, filed Jun. 30, 2017 the contents of which are incorporated by reference herein.

The present disclosure relates to Doherty amplifiers, and in particular to Doherty amplifiers that can include a transformer for impedance transformation.

According to a first aspect of the present disclosure there is provided a Doherty amplifier comprising:
  a main-power-amplifier having a main-amp-output-terminal;
  a peaking-power-amplifier having a peaking-amp-output-terminal;
  a combining node;
  a main-output-impedance-inverter connected between the main-amp-output-terminal and the combining node; and
  a transformer connected between the peaking-amp-output-terminal and the combining node.

In one or more embodiments the transformer comprises two magnetically coupled inductors.

In one or more embodiments the transformer comprises an autotransformer. The autotransformer may comprise a first-end-terminal, a second-end-terminal and an intermediate-terminal. The first-end-terminal may be galvanically connected to the combining node. The intermediate-terminal may be galvanically connected to the peaking-amp-output-terminal. The second-end-terminal may be connected to a reference terminal.

In one or more embodiments the Doherty amplifier further comprises a shunt-capacitor. The shunt-capacitor may have: a first plate connected to the first-end-terminal of the autotransformer, and a second plate connected to the second-end-terminal of the autotransformer.

In one or more embodiments the Doherty amplifier further comprises a high-pass-capacitor and a high-pass-inductor. The high-pass-capacitor may be connected between (i) the first-end-terminal of the autotransformer, and (ii) the combining node. The high-pass-inductor may be connected between the combining node and the reference terminal.

In one or more embodiments the Doherty amplifier further comprises a compensation-capacitor connected between (i) the first-end-terminal of the autotransformer, and (ii) the combining node.

In one or more embodiments the main-output-impedance-inverter comprises a CLC-inductor, a first-CLC-capacitor and a second-CLC-capacitor. The CLC-inductor may be connected between the main-amp-output-terminal and the combining node. The first-CLC-capacitor may be connected between the main-amp-output-terminal and the reference terminal. The second-CLC-capacitor may be connected between the combining node and the reference terminal. The component values of the CLC-inductor, the first-CLC-capacitor and the second-CLC-capacitor are set such that they absorb an output capacitance of the main-power-amplifier.

In one or more embodiments the peaking-power-amplifier has a peaking-amp-input-terminal. The Doherty amplifier may further comprise: a Doherty-input-terminal; and a peaking-input-transmission-line connected between the peaking-amp-input-terminal and the Doherty-input-terminal. The main-power-amplifier may have a main-amp-input-terminal that is connected directly to the Doherty-input-terminal.

In one or more embodiments the Doherty amplifier further comprises a matching network. The matching network may comprise a matching-capacitor and a matching-inductor. The matching-capacitor and the matching-inductor may be connected in series between the combining node and a reference terminal.

In one or more embodiments a Doherty-output-terminal is provided as a node between the matching-capacitor and the matching-inductor.

In one or more embodiments the transformer comprises a first-winding and a second-winding. The first-winding may be magnetically coupled to the second-winding. The first-winding may be galvanically connected between the peaking-amp-output-terminal and a reference terminal. The second-winding may be galvanically connected between the combining node and the reference terminal.

There may be provided a Doherty amplifier device comprising:
  an integrated circuit;
  a laminate;
  a Doherty amplifier comprising:
    a main-power-amplifier having a main-amp-output-terminal;
    a peaking-power-amplifier having a peaking-amp-output-terminal;
    a combining node; and
    one or more of the following:
      a main-output-impedance-inverter, wherein the main-output impedance comprises a CLC-inductor, a first-CLC-capacitor and a second-CLC-capacitor, wherein:
        the CLC-inductor is connected between the main-amp-output-terminal and the combining node;
        the first-CLC-capacitor is connected between the main-amp-output-terminal and a reference terminal; and
        the second-CLC-capacitor is connected between the combining node and the reference terminal;
      an autotransformer that comprises a first-end-terminal, a second-end-terminal and an intermediate-terminal, wherein:
        the first-end-terminal is galvanically connected to the combining node;
        the intermediate-terminal is galvanically connected to the peaking-amp-output-terminal; and
        the second-end-terminal is connected to the reference terminal
      a shunt-capacitor, wherein the shunt-capacitor has:
        a first plate connected to the first-end-terminal of the autotransformer, and
        a second plate connected to the second-end-terminal of the autotransformer;
      a high-pass-capacitor and a high-pass-inductor, wherein:
        the high-pass-capacitor is connected between (i) the first-end-terminal of the autotransformer, and (ii) the combining node; and
        the high-pass-inductor is connected between the combining node and the reference terminal;
      a matching network, wherein the matching network comprises a matching-capacitor and a matching-inductor, wherein the matching-capacitor and the matching-inductor are connected in series between the combining node and the reference terminal.

Optionally:
one or more of the autotransformer, the high-pass-capacitor, the shunt-capacitor and the first-CLC-capacitor are provided by the integrated circuit, and
one or more of the high-pass-inductor, the CLC-inductor, the second-CLC-capacitor, the matching-capacitor and the matching-inductor are provided on the laminate.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

BRIEF DESCRIPTION OF DRAWINGS

One or more embodiments will now be described by way of example only with reference to the accompanying drawings in which.

Following the trend in wireless infrastructure, there is a move towards more heterogeneous networks to fulfil the global demand for high data rate services. Small-cell base stations can be deployed to enhance the capacity in the networks by increased re-use of the frequency spectrum over a denser grid. This brings the power level per small-cell base station power amplifier (PA) into the SiGe and GaAs domain with power levels up to 4 W peak.

Doherty power amplifiers are suitable for use in macro-cell base-station power amplifiers, since they deliver a good efficiency and linearity trade-off for reasonable cost, and can be used as a drop-in replacement for class-AB power amplifiers. Doherty power amplifiers can be considered as superior to envelope tracking or out-phasing for some applications.

Figure 1:
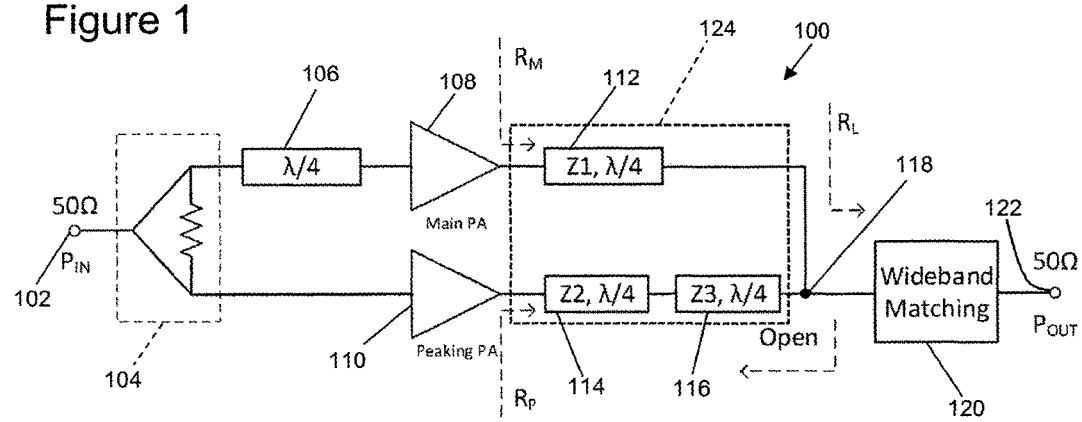
FIG. 1 shows a Doherty amplifier circuit.

FIG. 1 shows a Doherty amplifier circuit 100, which includes a wide-band Doherty combiner 124 that uses bulky transmission line transformers in the peaking path.

The Doherty amplifier circuit 100 has a Doherty-input-terminal 102 and a Doherty-output-terminal 122. Provided between the Doherty-input-terminal 102 and the Doherty-output-terminal 122 are a main stage, which includes a main-power-amplifier 108, and a peaking stage, which includes a peaking-power-amplifier 110. The main stage and the peaking stage are provided in parallel with each other.

The Doherty amplifier circuit 100 includes a splitter 104, which is connected to the Doherty-input-terminal 102, in order to provide input signals for the main-power-amplifier 108 and the peaking-power-amplifier 110. A main-input-transmission-line 106 is connected between the splitter 104 and the input of the main-power-amplifier 108 in order to provide a 90 degree ($\lambda/4$) phase shift.

The wide-band Doherty combiner 124 has a main-combiner-input-terminal, which is connected to the output terminal of the main-power-amplifier 108, and also has a peaking-combiner-input-terminal, which is connected to the output terminal of the peaking-power-amplifier 110. The wide-band Doherty combiner 124 also has a combiner-output-terminal that is connected to a combining node 118.

A main-output-transmission-line 112 is connected between the main-combiner-input-terminal and the combiner-output-terminal. A first-peaking-output-transmission-line 114 and a second-peaking-output-transmission-line 116 are connected in series with each other between the peaking-combiner-input-terminal and the combiner-output-terminal. The second-peaking-output-transmission-line 116 is included such that when the signals in the main and peaking stages are combined before being provided to the Doherty-output-terminal 122, they are in phase with each other.

Each of the main-output-transmission-line 112, the first-peaking-output-transmission-line 114, and the second-peaking-output-transmission-line 116 provides a 90 degree ($\lambda/4$) phase shift. Therefore, when the functionality of the Doherty combiner 124 is combined with that of the main-input-transmission-line 106, the signals in the main and peaking paths are in phase with each other when they reach the combining node 118.

As shown in FIG. 1, a wideband matching network is connected between the combining node 118 and the Doherty-output-terminal 122 such that the output impedance of the Doherty amplifier can be matched with a load that is connected to the Doherty-output-terminal 122.

The wide-band asymmetrical Doherty combiner 124 can apply impedance transformation in the peaking path, using a direct lumped-element translation of a transmission-line. This implementation may not necessarily lead to an acceptable solution in terms of bandwidth, integration level, and/or component count for all applications.

One or more of the examples disclosed below can advantageously avoid the use of bulky transmission lines in the peaking path, or lumped-element equivalent circuit implementations of those transmission lines. Instead, the below examples can utilise an impedance transformation in the peaking path that is built around a real transformer. The real transformer can beneficially be implemented as an autotransformer if a high turns ratio (for example, n>2) is required, since it can have lower loss and lower leakage inductance (and therefore wider bandwidth) compared to a conventional transformer topology.

Figure 2:
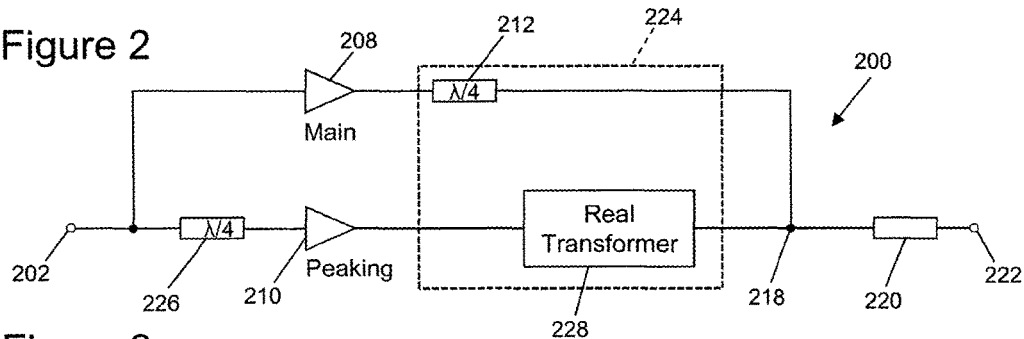
FIG. 2 shows an example embodiment of a Doherty amplifier that includes a transformer in the peaking stage.

FIG. 2 shows an example embodiment of a Doherty amplifier 200. The Doherty amplifier 200 includes a transformer 228 in the peaking stage. The transformer 228 may also be referred to as a peaking transformer. The transformer 228 can advantageously enable wideband amplifier operation. This can be because the transformer can have low losses and/or a low leakage inductance Also, in some examples use of the transformer can enable the Doherty amplifier to be implemented as a highly integrated circuit with a low component count.

The Doherty amplifier 200 includes a Doherty-input-terminal 202 and a Doherty-output-terminal 222. As with FIG. 1, a main stage and a peaking stage are connected in parallel with each other between the Doherty-input-terminal 202 and a combining node 218, and the combining node 218 is connected to the Doherty-output-terminal 222 through a matching network 220.

The Doherty amplifier 200 also includes a main-power-amplifier 208 and a peaking-power-amplifier 210. The main-power-amplifier 208 has a main-amp-input-terminal and a main-amp-output-terminal. The main-amp-input-terminal is connected directly to the Doherty-input-terminal 202. A main-output-transmission-line 212 is connected between the main-amp-output-terminal and the combining node 218. The main-output-transmission-line 212 is an example of a main-output-impedance-inverter. The peaking-power-amplifier 210 has a peaking-amp-input-terminal and a peaking-amp-output-terminal. A peaking-input-transmission-line 226, which provides a 90 degree (λ/4) phase shift, is connected between the peaking-amp-input-terminal and the Doherty-input-terminal 202. The peaking-amp-output-terminal is connected to a transformer-input-terminal of the transformer 228. The transformer 228 also has a transformer-output-terminal that is connected to the combining node 218. In this way, the transformer 228 is connected between the peaking-amp-output-terminal and the combining node 218.

In contrast to the circuit of FIG. 1, a quarter-lambda transmission line (the peaking-input-transmission-line 226) is placed in front of the peaking-power-amplifier, instead of at the input of the main-power-amplifier 208 in order for the signals to arrive in phase at the combining node 218. This assumes that the total phase shift in the transformer 228 is zero degrees, which is the case for an ideal (auto)transformer. Therefore, in FIG. 2, there is no need to compensate for an additional 90 degrees in the peaking branch of the combiner as is the case for FIG. 1.

The main-output-transmission-line 212 and the transformer 228 can be considered together as an improved wide-band Doherty combiner 224 because, as indicated above, wideband performance can be achieved.

Figure 3:
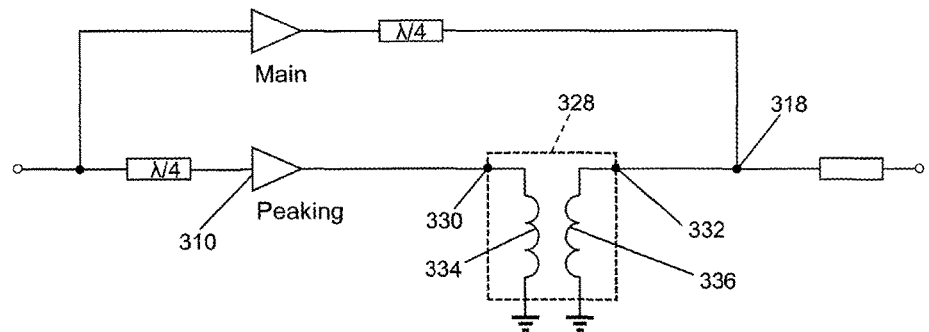
FIG. 3 shows an example implementation of the Doherty amplifier of FIG. 2.

FIG. 3 shows an example implementation of the Doherty amplifier of FIG. 2. Features of FIG. 3 that have already been described with reference to FIG. 2 will not necessarily be described again here. FIG. 3 also shows a reference terminal 338, which in this implementation is a ground terminal.

In this example, the transformer 328 includes a first-winding 334 and a second-winding 336. The first-winding 334 is magnetically coupled to the second-winding 336. The first-winding 334 has a first-winding-first-end that is connected to the transformer-input-terminal 330, and also has a first-winding-second-end that is connected to the reference terminal 338. The second-winding 336 has a second-winding-first-end that is connected to the transformer-output-terminal 332, and also has a second-winding-second-end that is connected to the reference terminal 338. In this way, the first-winding 334 is galvanically connected between the peaking-amp-output-terminal and the reference terminal 338, and the second-winding 336 is galvanically connected between the combining node 318 and the reference terminal 338.

The transformer 328 of FIG. 3, and other transformers disclosed herein, includes two magnetically coupled inductors.

Figure 4:
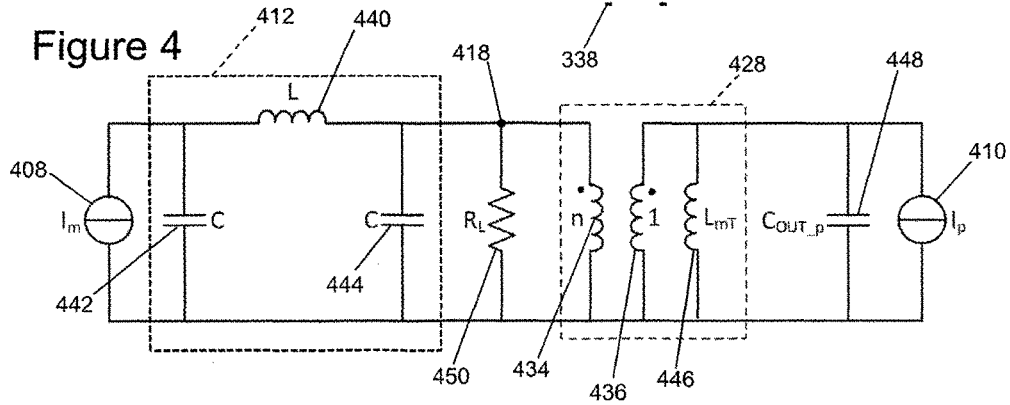
FIG. 4 shows a lumped-element model of the wide-band Doherty combiner of FIG. 3 with an ideal transformer.

FIG. 4 shows a lumped-element model of the wide-band Doherty combiner of FIG. 3 with an ideal transformer. It has been found that for a small-cell medium power amplifier (MPA), an asymmetrical lumped-element Doherty combiner can be designed for reasonably wide bandwidths (>20%) if an impedance transformation circuit is added between the peaking-power-amplifier and the combining node, as shown in FIG. 3.

In FIG. 4, a main-current source ($I_m$) 408 is used to represent the main-power-amplifier, and a peaking-current source ($I_p$) 410 is used to represent the peaking-power-amplifier.

A CLC circuit 412 is a lumped-element equivalent circuit of the main-output-transmission-line, which is used as an impedance inverter. The CLC circuit 412 includes a CLC-inductor 440, a first-CLC-capacitor 442 and a second-CLC-capacitor 444. The component values of the CLC circuit 412 can be designed such that they absorb the output capacitance of the main-power-amplifier (not shown).

The CLC-inductor 440 has a CLC-inductor-first-terminal and a CLC-inductor-second-terminal. The CLC-inductor-first-terminal is connected to a first terminal of the main-current source ($I_m$) 408. The CLC-inductor-second-terminal is connected to the combing node 418. In this way, the CLC-inductor 440 is connected between the output terminal of the main-power-amplifier and the combining node 418.

The first-CLC-capacitor 442 has a first-CLC-capacitor-first-plate that is connected to a first terminal of the main-current source ($I_m$) 408, and a first-CLC-capacitor-second-plate that is connected to a second terminal of the main-current source ($I_m$) 408. That is, the first-CLC-capacitor-first-plate is also connected to the CLC-inductor-first-terminal. In this way, the first-CLC-capacitor 442 is connected in parallel with the main-current source ($I_m$) 408. The first-CLC-capacitor 442 is thus connected between the output terminal of the main-power-amplifier and the reference terminal.

The second-CLC-capacitor 444 has a second-CLC-capacitor-first-plate that is connected to the combining node 418, and a second-CLC-capacitor-second-plate that is connected to a second terminal of the main-current source ($I_m$) 408. That is, the second-CLC-capacitor-first-plate is also connected to the CLC-inductor-second-terminal. In this way, the series combination of the second-CLC-capacitor 444 and the CLC-inductor 440 are connected in parallel with the main-current source ($I_m$) 408. The second-CLC-capacitor 444 and the CLC-inductor 440 are thus connected in series with each other between the output terminal of the main-power-amplifier and the reference terminal. Also, the second-CLC-capacitor 444 is connected between the combining node 418 and the reference terminal.

The transformer 428 is modelled by its first-winding 434, second-winding 436 and a magnetizing inductance ($L_{mT}$) 446. The transformer 428 can be designed such that the magnetizing inductance ($L_{mT}$) tunes out the output capacitance ($C_{OUT\_P}$) 448 of the peaking-power-amplifier.

A load resistance ($R_L$) 450 is shown connected to the combining node 418, and represents the combining point impedance. As is known in the art, the combining point impedance should advantageously be transformed to the load impedance of the Doherty amplifier, which in this example is a 50 Ohm antenna impedance. Two examples of additional transformation circuitry that can be used to transform the combining node impedance in this way are shown in FIG. 5.

Figure 5:
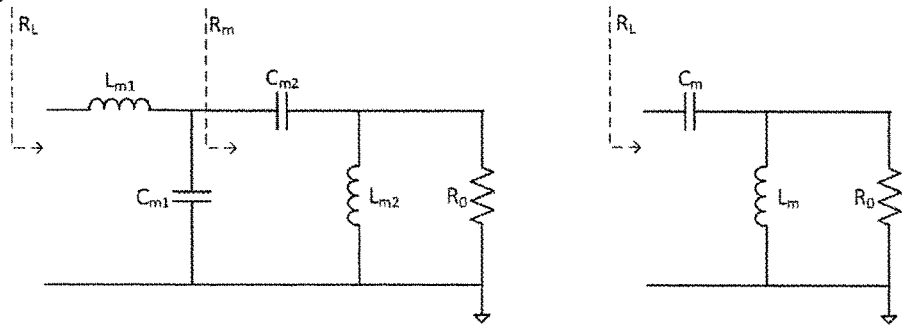
FIG. 5 shows two examples of how the load resistance of FIG. 4 can be implemented using a matching network.

FIG. 5 shows two examples of how the load resistance ($R_L$) of FIG. 4 can be implemented as an output impedance matching network: (i) a band-pass LCCL-matching network; and (ii) a high-pass CL-matching network. The high-pass section can have some reactance compensation with the lumped-element impedance inverter in the main path (not shown in FIG. 5), which can make the overall combiner response somewhat more broader band. Furthermore, the capacitors ($C_m$ and $C_{m2}$) serve as dc-blocking capacitors.

Returning to FIG. 4, in its most elementary form, the transformer 428 can be characterized by its turns-ratio n (voltage gain). The transformer 428 can be particularly useful for wide-band operation if the turns-ratio lies between n=√(1/α) and n=1/α, for a wideband asymmetrical Doherty combiner design. In which α is a measure for the power back-off level at which the Doherty PA operates on average ($\alpha^2 = P_{O,\alpha}/P_{O,max}$)

Where $P_{O,\alpha}$ is the power level at back-off operation; and $P_{O,max}$ is the maximum output power of the Doherty power amplifier.

Beneficially, by setting the turns-ratio in this way, the loss factor and load mismatch of the main path at full power, and also at back-off power, can enable wideband operation to be achieved. For example, for an asymmetrical Doherty combiner with α=3/8, 8.5 dB back-off across a frequency range of interest of 1.8-2.2 GHz, can be achieved.

Figure 6:
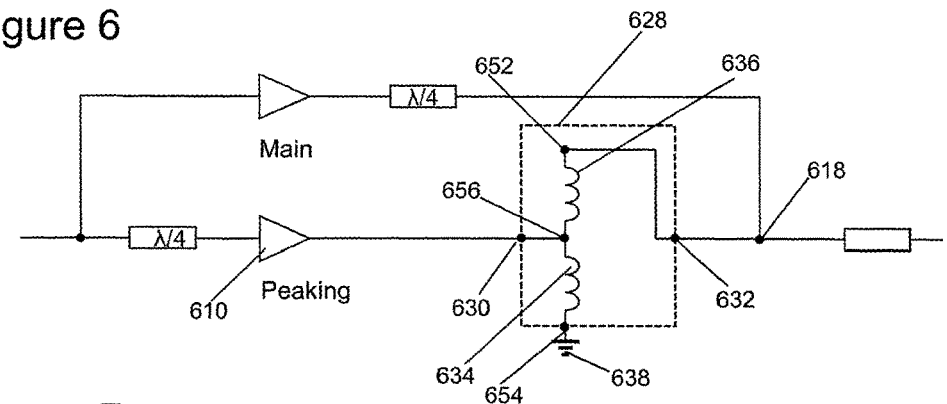
FIG. 6 shows another example implementation of the Doherty amplifier of FIG. 2.

FIG. 6 shows another example implementation of the Doherty amplifier of FIG. 2. Features of FIG. 6 that have already been described with reference to an earlier figure will not necessarily be described again here.

In this example, the transformer is provided as an autotransformer 628, which includes a first-sub-winding 634 and a second-sub-winding 636 that are connected in series with each other. In this way, the two sub-windings 634, 636 can together be considered as a single winding. The autotransformer 628 has a first-end-terminal 652, a second-end-terminal 654 and an intermediate-terminal 656. The intermediate-terminal 656 corresponds to the junction between the sub-windings.

The first-sub-winding 634 has a first-sub-winding-first-end that is connected to the transformer-input-terminal 630, and also has a first-sub-winding-second-end that is connected to the reference terminal 638. The second-sub-winding 636 has a second-sub-winding-first-end that is connected to the transformer-input-terminal 630, and also has a second-sub-winding-second-end that is connected to the transformer-output-terminal 632. In this way, the first-end-terminal 652 of the autotransformer 628 is galvanically connected to the combining node 618; the intermediate-terminal 656 is galvanically connected to the peaking-amp-output-terminal via the transformer-input-terminal 630; and the second-end-terminal 654 is connected to the reference terminal 638. The autotransformer 628 can therefore perform an impedance up-transformation, which can be useful when the impedance of the peaking-power-amplifier 610 is lower than that of the combining node 618 (or an antenna that is to be connected to the combining node 618).

In another example, the autotransformer can be located in the peaking path the other way around in order to perform an impedance down-transformation. That is, the intermediate-terminal 656 of the autotransformer 628 can be galvanically connected to the combining node 618; the first-end-terminal 652 can be galvanically connected to the peaking-amp-output-terminal via the transformer-input-terminal 630; and the second-end-terminal can be connected to the reference terminal 638.

Implementing the transformer as an autotransformer can be advantageous in terms of the size of the circuit, and bandwidth. In particular, use of an autotransformer can be particularly advantageous if a high turns ratio is required (for example, n>2) and DC isolation is not important. Generally, an autotransformer can have lower losses and lower leakage inductance, which can result in a wider bandwidth, when compared with a conventional transformer topology.

Figure 7:
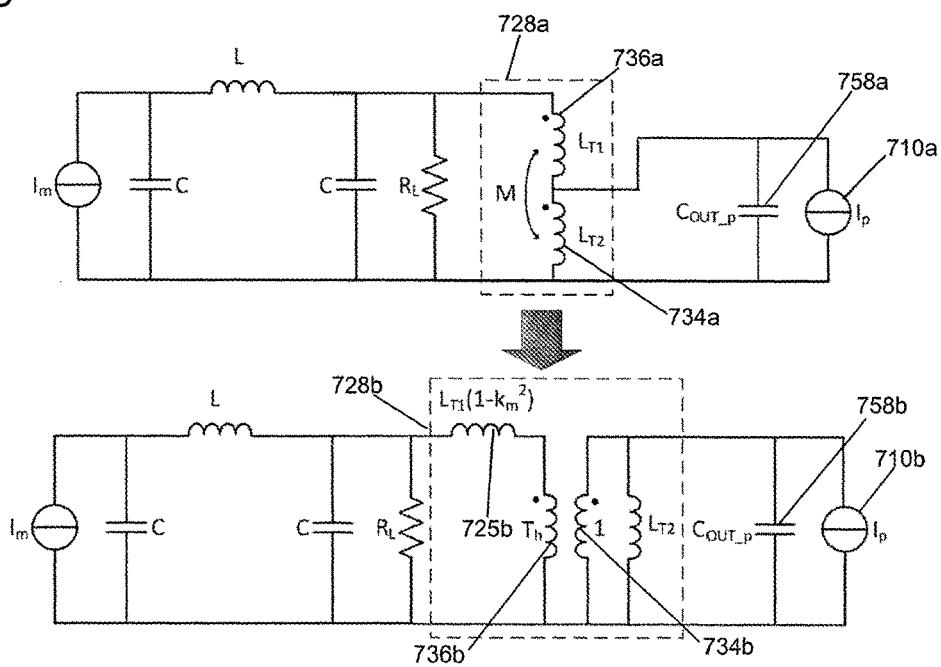
FIG. 7 shows a lumped-element representation of the wideband asymmetrical Doherty combiner topology of FIG. 6, and its equivalent circuit model representation.

FIG. 7 shows a lumped-element representation of the wideband asymmetrical Doherty combiner topology of FIG. 6, and its equivalent circuit model representation (bottom). This equivalent model representation of the autotransformer has been found to be relatively close to an ideal transformer model.

The magnetizing inductance $L_{T2}$ 734a, 734b is the lower half of the autotransformer 728a, 728b, and it can resonate with the output capacitance $C_{OUT\_p}$ 758a, 758b of the peaking-power-amplifier 710a, 710b. In this model, advantageously the turns-ratio $n = T_h$ is not dependent on frequency because this is a property of a transformer (assuming that the resistive losses are neglected). This can be advantageous in comparison with other matching network circuits (for example, LC matching) where the transformation itself is frequency dependent. However, as shown in the equivalent circuit model representation, a leakage inductance $L_{T1}(1-k_m^2)$ 725b is placed in series with the output. This leakage inductance will cause a non-zero phase shift across the peaking transformer 728a, 728b, and therefore can influence the overall impedance transformation ratio and bandwidth.

Figure 8:
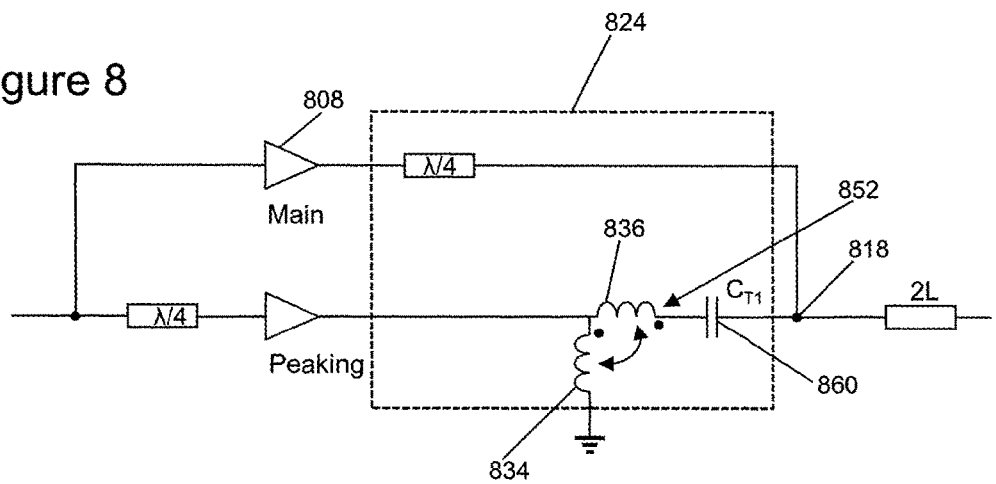
FIG. 8 shows another example implementation of a Doherty amplifier.
Figure 9:
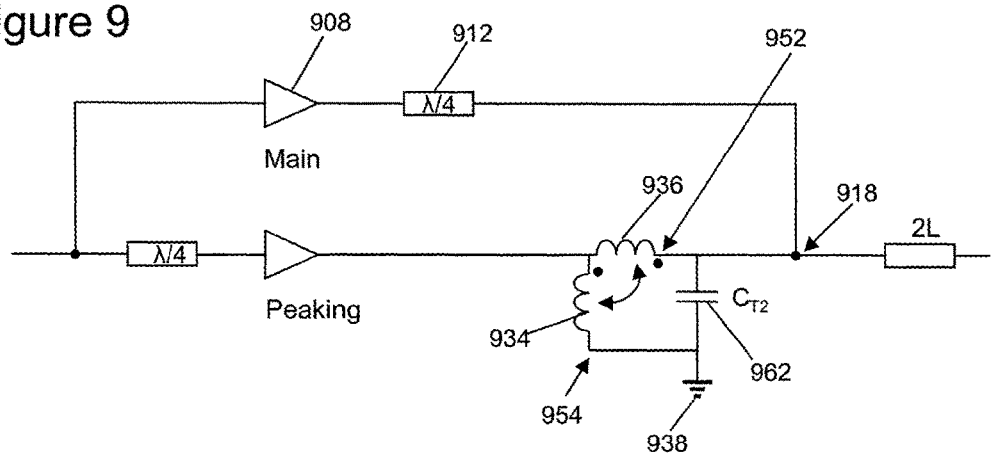
FIG. 9 shows another example implementation of a Doherty amplifier.

FIGS. 8, 9 and 10 show example Doherty amplifiers that include components that can reduce the effect of such a leakage inductance 725b.

FIG. 8 shows another example implementation of a Doherty amplifier. Features of FIG. 8 that have already been described with reference to an earlier figure will not necessarily be described again here.

In FIG. 8, a compensation-capacitor $C_{T1}$ 860 is connected in series between (i) the first-end-terminal 852 of the autotransformer, and (ii) the combining node 818. Use of the to compensation-capacitor $C_{T1}$ 860 can enable the portion of the Doherty combiner 824 in the peaking path to provide a zero phase shift, which can be advantageous in some applications. However, a drawback is that the compensation-capacitor $C_{T1}$ 860 blocks dc current to flow from the autotransformer to the main amplifier 808, which may result in another dc-feed inductor being required in the main path.

FIG. 9 shows another example implementation of a Doherty amplifier. Features of FIG. 9 that have already been described with reference to an earlier figure will not necessarily be described again here.

In FIG. 9, a shunt-capacitor $C_{T2}$ 962 is connected in parallel with both sub-windings 934, 936 of the autotransformer. That is, the shunt-capacitor $C_{T2}$ 962 has a first plate that is connected to the first-end-terminal 952 of the autotransformer, and the shunt-capacitor $C_{T2}$ 962 has a second plate that is connected to the second-end-terminal 954 of the autotransformer. Use of the shunt-capacitor $C_{T2}$ 962 can provide shunt compensation, which can give additional impedance transformation, can allow dc current to flow from the autotransformer to the main amplifier 908, while the shunt-capacitor $C_{T2}$ 962 can be easily absorbed in the lumped-element equivalent of the quarter-wave transmission line 912 in the main stage, which as described above can be a CLC circuit. However, use of the shunt-capacitor $C_{T2}$ 962 may not adequately address the additional phase shift issue that is discussed above in relation to leakage inductance.

Figure 10A:
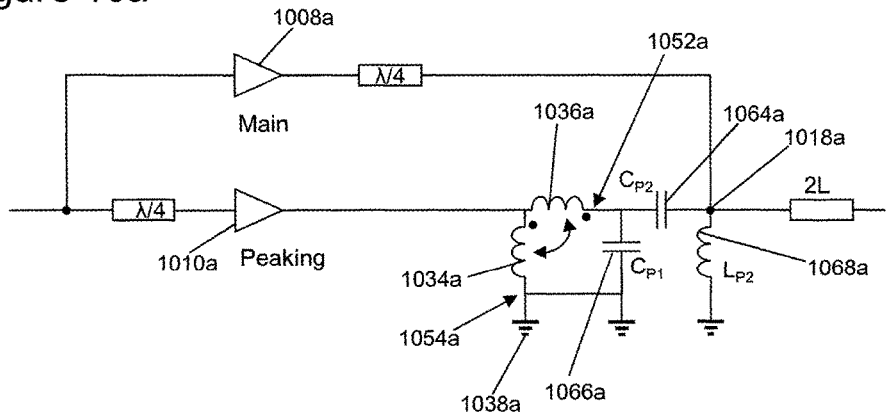
FIG. 10*a* shows another example implementation of a Doherty amplifier.

FIG. 10a shows another example implementation of a Doherty amplifier. Features of FIG. 10a that have already been described with reference to an earlier figure will not necessarily be described again here.

The circuit of FIG. 10a includes a shunt-capacitor $C_{P1}$ 1066a, a high-pass-capacitor $C_{P2}$ 1064a, and a high-pass-inductor $L_{P2}$ 1068a. The shunt-capacitor $C_{P1}$ 1066a is connected in parallel with both sub-windings 1034a, 1036a of the autotransformer, in the same way as FIG. 9. The high-pass-capacitor $C_{P2}$ 1064a is connected between (i) the first-end-terminal 1052a of the autotransformer, and (ii) the combining node 1018a. The high-pass-inductor $L_{P2}$ 1068a is connected between the combining node 1018a and the reference terminal 1038a.

The components of FIG. 10a can be used to tune the leakage inductance (not shown) with the shunt-capacitor $C_{P1}$ 1066a. The leakage-inductance and the shunt capacitor $C_{P1}$ 1066a can provide a tuned low-pass matching section with a phase rotation of −θ, while the high-pass section (the high-pass-capacitor $C_{P2}$ 1064a and the high-pass-inductor $L_{P2}$ 1068a) can compensates this phase rotation with +θ. That is, the high-pass-capacitor $C_{P2}$ 1064a and the high-pass-inductor $L_{P2}$ 1068a can together be referred to as a high-pass section that can compensate for the additional phase rotation that occurs due to the leakage inductance. The example of FIG. 10a can split the total impedance transformation between (i) the autotransformer, and (ii) the additional LC-CL transformer that incorporates the leakage inductance. That is, the "additional LC-CL transformer" can be made up of: the shunt-capacitor $C_{P1}$ 1066a, the high-pass-capacitor $C_{P2}$ 1064a, the high-pass-inductor $L_{P2}$ 1068a and the leakage inductance (not shown).

Also, in FIG. 10a, a dc-supply point is naturally created for the main-power-amplifier 1008a by the high-pass-inductor $L_{P2}$ 1068a, while the peaking-power-amplifier 1010a is supplied from the autotransformer.

Figure 10B:
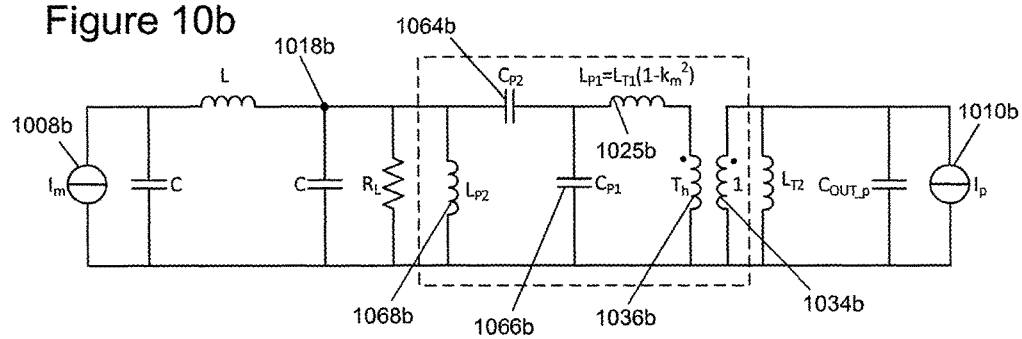
FIG. 10*b* shows a lumped-element model of the wide-band Doherty combiner of FIG. 10*a*.

FIG. 10b shows a lumped-element model of the wideband Doherty combiner of FIG. 10a. Components that have already been described with reference to FIG. 10a have been given corresponding reference numbers with a 'b' suffix, and will not necessarily be described again with reference to FIG. 10b.

FIG. 10b also shows a leakage inductance $L_{T1}$ $(1-k_m^2)$ 1025b in the same way as FIG. 7.

Figure 11:
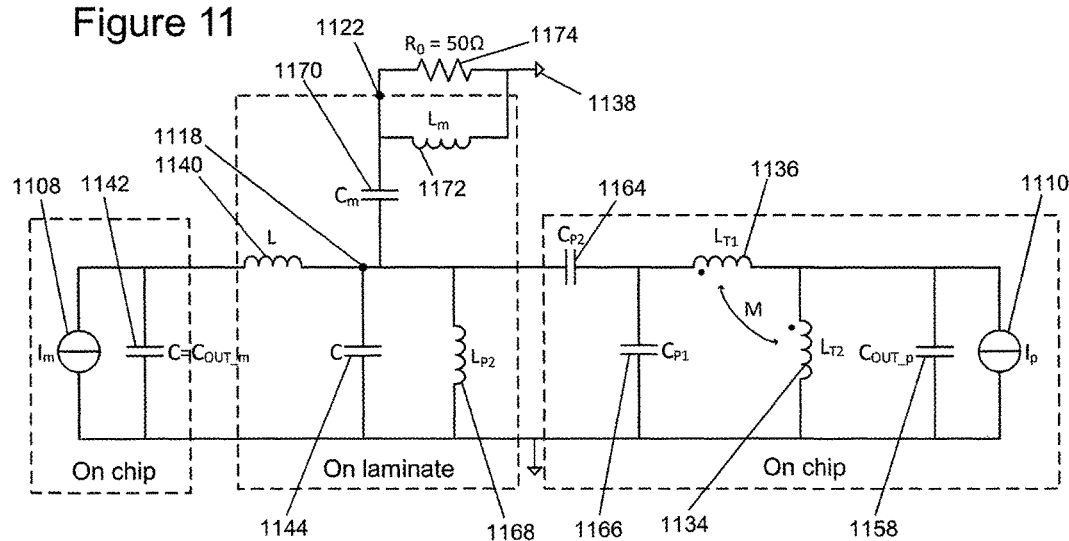
FIG. 11 shows a lumped-element model of an example embodiment of a wide-band Doherty combiner.

FIG. 11 shows a lumped-element model of an example embodiment of a wide-band Doherty combiner. Features of FIG. 11 that have already been described with reference to an earlier figure will not necessarily be described again here. Some of the components are implemented on a chip (that is, integrated in an integrated circuit (IC)), and some of the components are implemented on a laminate, which can result in a compact solution.

The laminate and the chip can together be considered as part of the same Doherty amplifier device. In this way, FIG. 11 shows how the design can be partitioned between the chip and a laminate-based PA module (such as a dual-layer laminate from AMKOR). Partitioning the design between the chip and the laminate can be a cost effective implementation, for example in terms of package size and surface mounted devices (SMD) component count. The most critical matching elements, which determine the overall loss of the combiner (both in the main PA path and after the combining node) can be provided on the laminate. This can enable high quality factor inductors to be used. In contrast, the peaking transformer can be mostly integrated, apart from the high-pass-inductor $L_{P2}$ 1168 in this example. The main purpose of the peaking power amplifier is to deliver the maximum output power.

The Doherty combiner includes an autotransformer having a first-sub-winding 1134 and a second-sub-winding 1136, which is the same as the autotransformer of FIGS. 10a and 10b. The circuit also includes a high-pass-capacitor $C_{P2}$ 1164 and a shunt-capacitor $C_{P1}$ 1166, which are also the same as the corresponding components of FIGS. 10a and 10b. Each of these components, along with the main-power-amplifier 1108 and the peaking-power-amplifier 1110, are provided on the chip in this example. In some applications, capacitors that are implemented on the chip can have lower losses than those that are implemented on the laminate. In this example, it can be advantageous to implement the high-pass-capacitor $C_{P2}$ 1164 and the shunt-capacitor $C_{P1}$ 1166 in particular on the chip because this can reduce the size and cost of the package (including surface mounted devices). Also, these components can contribute to the losses of the Doherty combiner.

The high-pass-inductor $L_{P2}$ 1168 of FIGS. 10a and 10b is provided on the laminate.

The Doherty combiner includes a CLC circuit, such as the one illustrated in FIG. 4, which is a lumped-element equivalent circuit of the main-output-transmission-line. The CLC circuit provides the functionality of an impedance inverter. In the same way as FIG. 4, the CLC circuit of FIG. 11 includes a CLC-inductor 1140, a first-CLC-capacitor 1142 and a second-CLC-capacitor 1144. The component values of the CLC circuit can be designed such that they absorb the output capacitance of the main-power-amplifier (not shown). In this example the first-CLC-capacitor 1142 is provided on the chip, and the CLC-inductor 1140 and the second-CLC-capacitor 1144 are provided on the laminate.

The load resistance of FIGS. 10 and 10b can be implemented as a matching network, in this example a high-pass CL-matching network such as the one illustrated on the right hand side of FIG. 5. In particular, the high-pass CL-matching network includes a matching-capacitor $C_m$ 1170 and a matching-inductor $L_m$ 1172. The matching-capacitor Cm 1170 and the matching-inductor $L_m$ 1172 are connected in series between the combining node 1118 and the reference terminal 1138. In this example, the matching-capacitor Cm 1170 and the matching-inductor $L_m$ 1172 are implemented on the laminate.

The matching-capacitor $C_m$ 1170 has a matching-capacitor-first-plate and a matching-capacitor-second-plate. The matching-inductor $L_m$ 1172 has a matching-inductor-first-terminal and a matching-inductor-second terminal. The matching-capacitor-first-plate is connected to the combining node 1118. The matching-capacitor-second-plate is connected to the matching-inductor-first-terminal. The matching-inductor-second terminal is connected to the reference terminal 1138. A Doherty-output-terminal 1122 is defined as a node between the matching-capacitor Cm 1170 and the matching-inductor $L_m$ 1172.

An output-resistor $R_O$ 1174 is also shown in FIG. 11, which in this example is a 50Ω output antenna load. The output-resistor $R_O$ 1174 is connected between the output-terminal 1122 and the reference terminal 1138.

The output capacitor $C_{OUT\_P}$ 1158 of the peaking-power-amplifier 1110, which is implemented on chip, can be distributed or divided over more than, for example, four sections of the peaking-power-amplifier 1110 output. The shunt-capacitor $C_{P1}$ 1166, which is also implemented on chip, can also be divided in more than one, for example two sections for layout symmetry. The shunt-capacitor $C_{P1}$ 1166 and the high-pass-capacitor $C_{P2}$ 1164 can be stacked on the chip, which can be advantageous because of any large voltage swings at the collector of the peaking-power-amplifier.

The CLC-inductor 1140, the high-pass-inductor $L_{P2}$ 1168, and the matching-inductor $L_m$ are realized on the laminate in this example with laminate micro strip lines (MSLs), which can have unloaded Q factors of more than 70.

Figure 12:
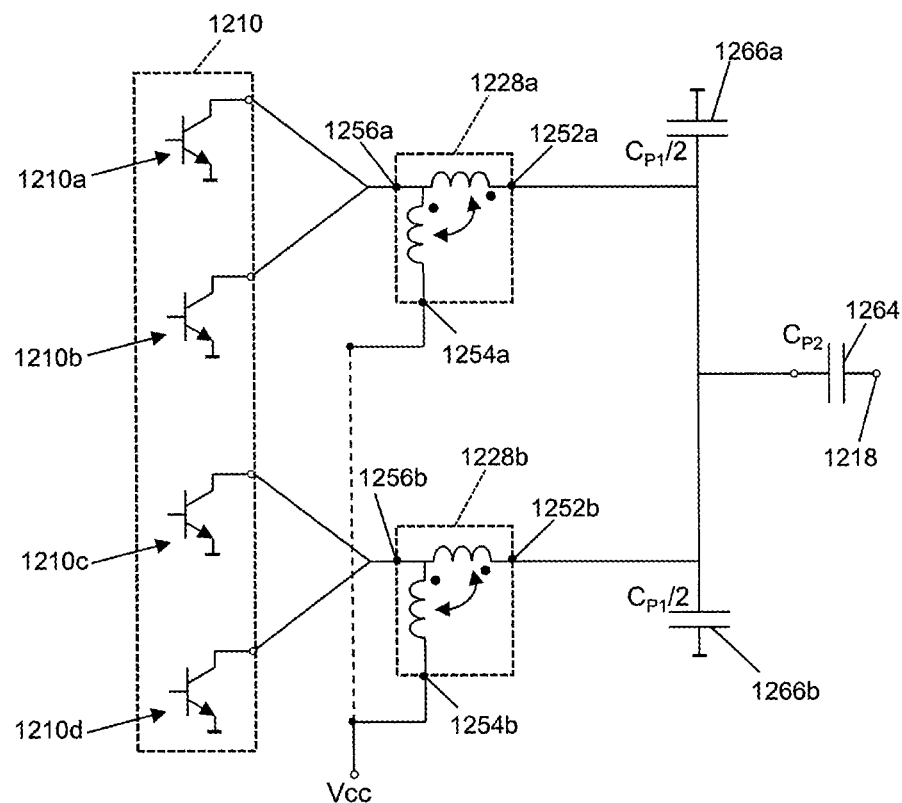
FIG. 12 shows an example embodiment of a practical implementation of the autotransformer of FIG. 11.

FIG. 12 shows an example embodiment of a practical implementation of the autotransformer of FIG. 11, or any other Doherty amplifier disclosed herein. FIG. 12 shows how the components on the right-hand side of FIG. 11 can be implemented on an integrated circuit.

In FIG. 12, the peaking amplifier is implemented as four separate "power cells" 1210a, 1210b, 1210c, 1210d. The autotransformer is implemented as two sub-autotransformers 1228a, 1228b, each comprising a sub-intermediate-terminal 1256a, 1256b; a sub first-end-terminal 1252a, 1252b; and a sub-second-end-terminal 1254a, 1254b. The shunt-capacitor $C_{P1}$ is implemented as two sub-shunt-capacitors $C_{P1}/2$ 1266a, 1266b.

Each power cell can comprise one or more power transistors, although only one power transistor is shown in each power cell in FIG. 12 in order to aid clarity. The output terminals of a pair of the power cells 1210a, 1210b are both connected to a sub-intermediate-terminal 1256a of an associated sub-autotransformer 1228a.

The sub first-end-terminal 1252a of the associated sub-autotransformer 1228a is connected to: (i) a first-plate of an associated sub-shunt-capacitor $C_{P1}/2$ 1266a; and (ii) a first plate of the high-pass-capacitor $C_{P2}$ 1264. A second plate of the associated sub-shunt-capacitor $C_{P1}/2$ 1266a is connected to a reference terminal. A second plate of the high-pass-capacitor $C_{P2}$ 1264 is connected to the combining node 1218.

The sub-second-end-terminal 1254a of the associated sub-autotransformer 1228a is connected to a supply voltage Vcc.

In this way, the design of FIG. 12 is based on two parallel connected stacked inductors, of which the center connection is tapped to create the actual autotransformer. The center-tap is split again, so that in total 4 connections are made to the peaking PA unit cells 1210. At the output of the autotransformer, the capacitances of the lumped-element transformer part can be integrated using stacked high-density single-nitride MIM capacitors.

It will be appreciated that any of the transformers disclosed herein can comprise two inductively coupled windings.

One or more of the circuits disclosed herein can be used in small-cell base station power amplifiers, and WLAN or cellular power amplifier applications, as non-limiting examples.

One or more of the circuits or systems described above can utilise high integration capabilities of a BiCMOS process, provide good power efficiency (>35%) across wide bandwidths (>20%), and also fit in a compact and cost-effective Quad-Flat-No-Leads (QFN) style package.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A Doherty amplifier comprising:
   a main-power-amplifier having a main-amp-output-terminal;
   a peaking-power-amplifier having a peaking-amp-output-terminal;
   a combining node;
   a main-output-impedance-inverter connected between the main-amp-output-terminal and the combining node; and a transformer connected between the peaking-amp-output-terminal and the combining node;
wherein the transformer comprises an autotransformer;
wherein the autotransformer comprises a first-end-terminal, a second-end-terminal and an intermediate-terminal, wherein:
the first-end-terminal is galvanically connected to the combining node;
the intermediate-terminal is galvanically connected to the peaking-amp-output-terminal; and
the second-end-terminal is connected to a reference terminal.

2. The Doherty amplifier of claim 1, wherein the transformer comprises two magnetically coupled inductors.

3. The Doherty amplifier of claim 1, further comprising a shunt-capacitor, wherein the shunt-capacitor has:
a first plate connected to the first-end-terminal of the autotransformer, and
a second plate connected to the second-end-terminal of the autotransformer.

4. The Doherty amplifier of claim 1, further comprising a high-pass-capacitor and a high-pass-inductor, wherein:
the high-pass-capacitor is connected between (i) the first-end-terminal of the autotransformer, and (ii) the combining node; and
the high-pass-inductor is connected between the combining node and the reference terminal.

5. The Doherty amplifier of claim 1, further comprising a compensation-capacitor connected between (i) the first-end-terminal of the autotransformer, and (ii) the combining node.

6. The Doherty amplifier of claim 1, wherein the main-output-impedance-inverter comprises a CLC-inductor, a first-CLC-capacitor and a second-CLC-capacitor, wherein:
the CLC-inductor is connected between the main-amp-output-terminal and the combining node;
the first-CLC-capacitor is connected between the main-amp-output-terminal and the reference terminal; and
the second-CLC-capacitor is connected between the combining node and the reference terminal.

7. The Doherty amplifier of claim 6, wherein the component values of the CLC-inductor, the first-CLC-capacitor and the second-CLC-capacitor are set such that they absorb an output capacitance of the main-power-amplifier.

8. The Doherty amplifier of claim 1, wherein the peaking-power-amplifier has a peaking-amp-input-terminal, the Doherty amplifier further comprising:
a Doherty-input-terminal; and
a peaking-input-transmission-line connected between the peaking-amp-input-terminal and the Doherty-input-terminal.

9. The Doherty amplifier of claim 8, wherein the main-power-amplifier has a main-amp-input-terminal that is connected directly to the Doherty-input-terminal.

10. The Doherty amplifier of claim 1, further comprising a matching network, wherein the matching network comprises a matching-capacitor and a matching-inductor, wherein the matching-capacitor and the matching-inductor are connected in series between the combining node and a reference terminal.

11. The Doherty amplifier of claim 10, wherein a Doherty-output-terminal is provided as a node between the matching-capacitor and the matching-inductor.

12. The Doherty amplifier of claim 1, wherein the transformer comprises a first-winding and a second-winding, wherein:
the first-winding is magnetically coupled to the second-winding;
the first-winding is galvanically connected between the peaking-amp-output-terminal and a reference terminal; and
the second-winding is galvanically connected between the combining node and the reference terminal.

13. A Doherty amplifier device comprising:
a Doherty amplifier comprising:
a main-power-amplifier having a main-amp-output-terminal;
a peaking-power-amplifier having a peaking-amp-output-terminal;
a combining node;
a main-output-impedance-inverter, wherein the main-output-impedance comprises a CLC-inductor, a first-CLC-capacitor and a second-CLC-capacitor, wherein:
the CLC-inductor is connected between the main-amp-output-terminal and the combining node;
the first-CLC-capacitor is connected between the main-amp-output-terminal and a reference terminal; and
the second-CLC-capacitor is connected between the combining node and the reference terminal;
an autotransformer that comprises a first-end-terminal, a second-end-terminal and an intermediate-terminal, wherein:
the first-end-terminal is galvanically connected to the combining node;
the intermediate-terminal is galvanically connected to the peaking-amp-output-terminal; and
the second-end-terminal is connected to the reference terminal
a shunt-capacitor, wherein the shunt-capacitor has:
a first plate connected to the first-end-terminal of the autotransformer, and
a second plate connected to the second-end-terminal of the autotransformer;
a high-pass-capacitor and a high-pass-inductor, wherein:
the high-pass-capacitor is connected between (i) the first-end-terminal of the autotransformer, and (ii) the combining node; and
the high-pass-inductor is connected between the combining node and the reference terminal;
a matching network, wherein the matching network comprises a matching-capacitor and a matching-inductor, wherein the matching-capacitor and the matching-inductor are connected in series between the combining node and the reference terminal;
an integrated circuit;
a laminate;
wherein:
the autotransformer, the high-pass-capacitor, the shunt-capacitor and the first-CLC-capacitor are provided by the integrated circuit, and
the high-pass-inductor, the CLC-inductor, the second-CLC-capacitor, the matching-capacitor and the matching-inductor are provided on the laminate.

14. A Doherty amplifier comprising:
a main-power-amplifier having a main-amp-output-terminal;
a peaking-power-amplifier having a peaking-amp-output-terminal;
a combining node;
a main-output-impedance-inverter connected between the main-amp-output-terminal and the combining node; and a transformer connected between the peaking-amp-output-terminal and the combining node;
wherein the peaking-power-amplifier has a peaking-amp-input-terminal, the Doherty amplifier further comprising:
  a Doherty-input-terminal; and
  a peaking-input-transmission-line connected between the peaking-amp-input-terminal and the Doherty-input-terminal;
wherein the main-power-amplifier has a main-amp-input-terminal that is connected directly to the Doherty-input-terminal.

15. A Doherty amplifier comprising:
a main-power-amplifier having a main-amp-output-terminal;
a peaking-power-amplifier having a peaking-amp-output-terminal;
a combining node;
a main-output-impedance-inverter connected between the main-amp-output-terminal and the combining node; and
a transformer connected between the peaking-amp-output-terminal and the combining node;
wherein the transformer comprises a first-winding and a second-winding, wherein:
  the first-winding is magnetically coupled to the second-winding;
  the first-winding is galvanically connected between the peaking-amp-output-terminal and a reference terminal; and
  the second-winding is galvanically connected between the combining node and the reference terminal.

* * * * *